United States Patent [19]
Nitta et al.

[11] Patent Number: 5,198,704
[45] Date of Patent: Mar. 30, 1993

[54] BI-CMOS OUTPUT CIRCUIT WITH LIMITED OUTPUT VOLTAGE

[75] Inventors: Yoshinori Nitta, Tokyo; Takeshi Sugoh, Yokosuka; Hiroyuki Hara, Fujisawa, all of Japan

[73] Assignee: Kabushiki Kaisha Toshiba, Kanagawa, Japan

[21] Appl. No.: 688,511

[22] PCT Filed: Oct. 3, 1990

[86] PCT No.: PCT/JP90/01277

§ 371 Date: Jul. 30, 1991

§ 102(e) Date: Jul. 30, 1991

[30] Foreign Application Priority Data

Oct. 4, 1989 [JP] Japan .................................. 1-259662

[51] Int. Cl.⁵ .......................................... H03K 19/01
[52] U.S. Cl. ........................................ 307/446; 307/443
[58] Field of Search ............... 307/443, 446, 451, 475, 307/570

[56] References Cited

U.S. PATENT DOCUMENTS

| | | | |
|---|---|---|---|
| 4,103,188 | 7/1978 | Morton | 307/446 X |
| 4,804,869 | 2/1989 | Masuda et al. | 307/446 |
| 4,827,159 | 5/1989 | Naganuma | 307/451 X |
| 4,845,385 | 7/1989 | Ruth, Jr. | 307/443 X |
| 4,845,386 | 7/1989 | Ueno | 307/446 |

*Primary Examiner*—David Hudspeth
*Attorney, Agent, or Firm*—Finnegan, Henderson, Farabow, Garrett and Dunner

[57] ABSTRACT

In a Bi-CMOS output circuit constituted by combining a bipolar transistor and a CMOS circuit, in an output circuit obtained by connecting current paths of two bipolar transistors in series between a power source and ground, when the bipolar transistor connected to ground is driven by a bipolar transistor, an output current value can be assured when an output voltage is low. However, when the output voltage is high, a large current is supplied to the bipolar transistor to vary a power source voltage. Therefore, the output terminal of the MOS transistor is connected through a resistor to the grounded control signal input terminal of the bipolar transistor. Since the bipolar transistor connected to the ground is driven by a MOS transistor having drivability lower than that of a normal bipolar transistor, when the output voltage is low, a predetermined current can be assured. When the output voltage is high, supply of a large current can be prevented.

9 Claims, 2 Drawing Sheets

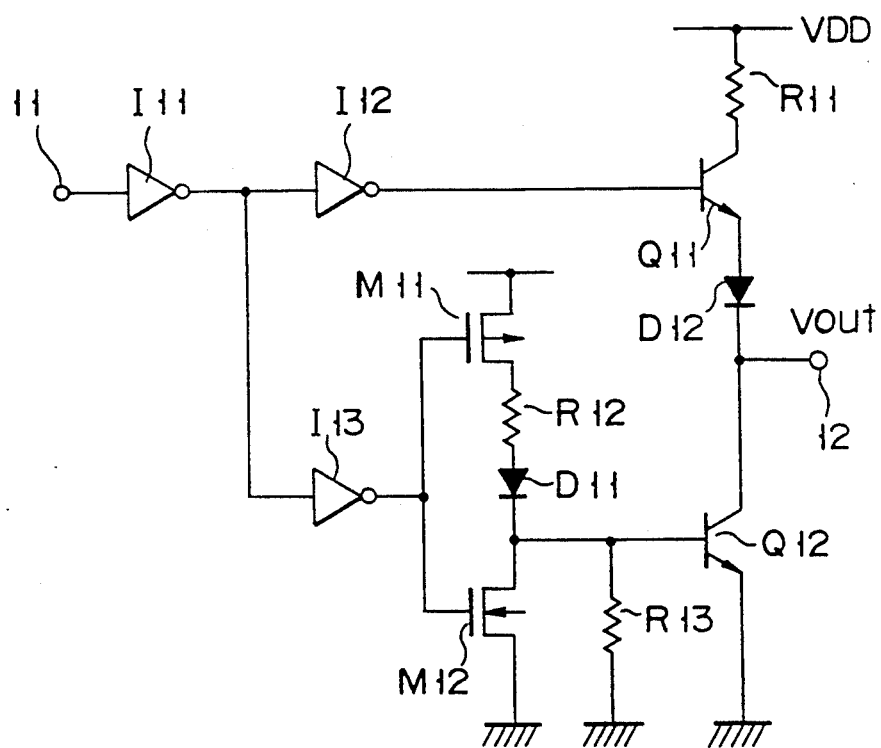
F I G. 1

BI-CMOS OUTPUT CIRCUIT WITH LIMITED OUTPUT VOLTAGE

TECHNICAL FIELD

The present invention relates to a Bi-CMOS output circuit as a combination of a bipolar transistor and a CMOS circuit and, more particularly, to a large-current output circuit.

BACKGROUND ART

FIG. 2 shows a conventional output circuit.

The input terminal of a first inverter I1 constituted by a p-channel MOS transistor M1 and an n-channel MOS transistor M2 is connected to an input terminal 1, and the input terminal of a second inverter I2 constituted by an n-channel MOS transistor M3 and a p-channel MOS transistor M4 is connected to the input terminal 1. The sources of the p-channel MOS transistors M1 and M3 constituting the first and second inverters I1 and I2 are connected to a power source $V_{DD}$, and the sources of the n-channel MOS transistors M2 and M4 are grounded. The output terminal of the second inverter I2 is connected to the base of an npn transistor Q1. The collector of the transistor Q1 is connected to the power source $V_{DD}$ through a resistor R1, and the emitter of the transistor Q1 is connected to an output terminal 2 through a diode D2.

The output terminal of the first inverter I1 is connected to the gates of a p-channel MOS transistor M5 and n-channel MOS transistors M6 and M7. The sources of the n-channel MOS transistors M6 and M7 are grounded, and a resistor R2 and a diode D1 are connected in series between the drains of the p-channel MOS transistor M5 and the n-channel MOS transistor M6. The base of an npn transistor Q2 is connected to the connection point between the diode D1 and the drain of the n-channel MOS transistor M6, and the base of the transistor Q2 is grounded through a resistor R3. The collector of the transistor Q2 is connected to the power source $V_{DD}$ and the source of the p-channel MOS transistor M5, and the emitter of the transistor Q2 is connected to the drain of the n-channel MOS transistor M7 and the base of an npn transistor Q3. The emitter of the transistor Q3 is grounded, and the collector thereof is connected to the output terminal I2. Therefore, the transistors Q1 and Q2 are totempole-connected to each other.

With the above arrangement, when the input terminal 1 is set at high level, the output from the inverter I1 goes to low level, the p-channel MOS transistor M5 is turned on and the n-channel MOS transistors M6 and M7 are turned off. Therefore, a base current is supplied to the base of the transistor Q2 through the p-channel MOS transistor M5, the resistor R2, and the diode D1, thereby turning on the transistor Q2. When the transistor Q2 is turned on, the transistor Q3 is turned on. At this time, since the transistor Q2 serves as an emitter follower, a large current is supplied to the transistor Q3.

FIG. 3 shows an output current when the output terminal 2 is set at low level. In FIG. 3, reference symbol I01 indicates a current flowing through the transistor Q3. As is apparent from FIG. 3, when tI output voltage Vout=0.5 V, an output current of A1=40 mA to 60 mA can be assured.

When the output voltage Vout=5 V, a large current of A2=700 to 800 mA is supplied to the transistor Q3. For this reason, when the transistor Q3 is turned on or off, the power source voltage $V_{DD}$ is varied by the large current, and an erroneous operation may be disadvantageously performed in other circuits (not shown) receiving the power source voltage $V_{DD}$.

DISCLOSURE OF INVENTION

An object of the present invention is to provide an output circuit capable of assuring an output current value when an output voltage is low, preventing supply of a large current when an output voltage is high, and suppressing a variation of power source voltage.

The present invention can be achieved by the following arrangement.

An output circuit is characterized by comprising first and second bipolar transistors which have output terminals connected in series with each other and which are alternately turned on in accordance with an output signal, a MOS transistor for supplying an operation current to a control signal input terminal of the second bipolar transistor in accordance with the input signal, and a resistor connected between an output terminal of the MOS transistor and the control signal input terminal of the second bipolar transistor.

According to the present invention, the output terminal of the MOS transistor turned on in accordance with an input signal is connected to the control signal input terminal of the second bipolar transistor through the resistor. Therefore, since the second bipolar transistor is driven by the MOS transistor having drivability lower than that of a normal bipolar transistor, when an output voltage is low, a predetermined current can be assured. When the output voltage is high, supply of a large current can be prevented.

BRIEF DESCRIPTION OF DRAWINGS

FIG. 1 is a circuit diagram showing an embodiment of the present invention,

BEST MODE OF CARRYING OUT THE INVENTION

An embodiment of the present invention will be described below with reference to the accompanying drawings.

Referring to FIG. 1, the input terminal of an inverter I11 is connected to an input terminal 11. The input terminals of inverters I12 and I13 are connected to the output terminal of the inverter I11. The base of an npn transistor Q11 serving as a first bipolar transistor is connected to the output terminal of the inverter I12. The collector of the npn transistor Q11 is connected to a power source $V_{DD}$ through a resistor R11, and the emitter of the transistor Q11 is connected to the output terminal 12 through a diode D12 and to the collector of an npn transistor Q12 serving as a second bipolar transistor.

The gates of a p-channel MOS transistor M11 and an n-channel MOS transistor M12 are connected to the output terminal of the inverter 13. The source of the p-channel MOS transistor M11 is connected to a power source, and the drain of the transistor M11 is connected to the base of the transistor Q12 through a diode D11 and to the drain of the n-channel MOS transistor M12.

The source of the n-channel MOS transistor M12 is grounded. The base of the npn transistor Q12 is grounded through a resistor R13, and the emitter of the transistor Q12 is grounded.

With the above arrangement an operation will be described below. When the input terminal 11 is set at high level, an output from the inverter I12 is set at high level, and the npn transistor Q11 is turned on. At this time, an output from the inverter I13 is set at high level, the p-channel transistor M11 is turned off, and the n-channel MOS transistor M12 is turned on. For this reason, the npn transistor Q12 is turned off. Therefore, the output terminal 12 goes to high level.

On the other hand, when the input terminal 11 is set at low level, the npn transistor Q11 is turned off through the inverters I11 and I12. At this time, the p-channel MOS transistor M11 is turned on through the inverter I13, and the n-channel MOS transistor M12 is turned off. Therefore, since a driver current is supplied to the base of the npn transistor Q12 through the p-channel MOS transistor M11, a resistor R12, and the diode D11, the npn transistor Q12 is turned on, and the output terminal 12 goes to low level.

Figure 2:
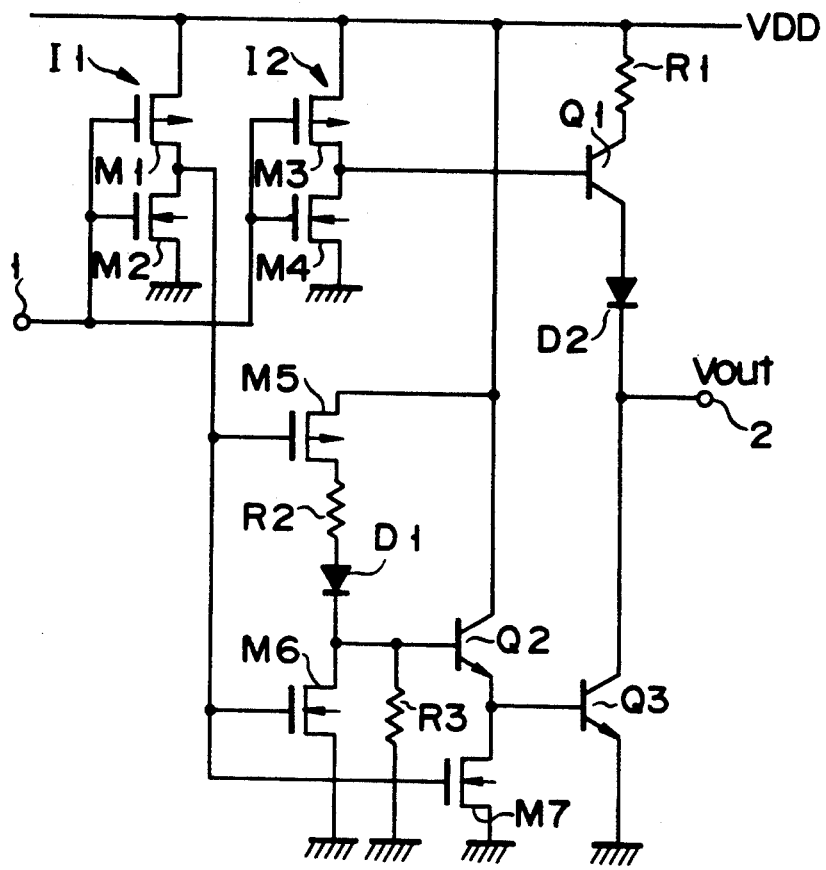
FIG. 2 is a circuit diagram showing a conventional output circuit.
Figure 3:
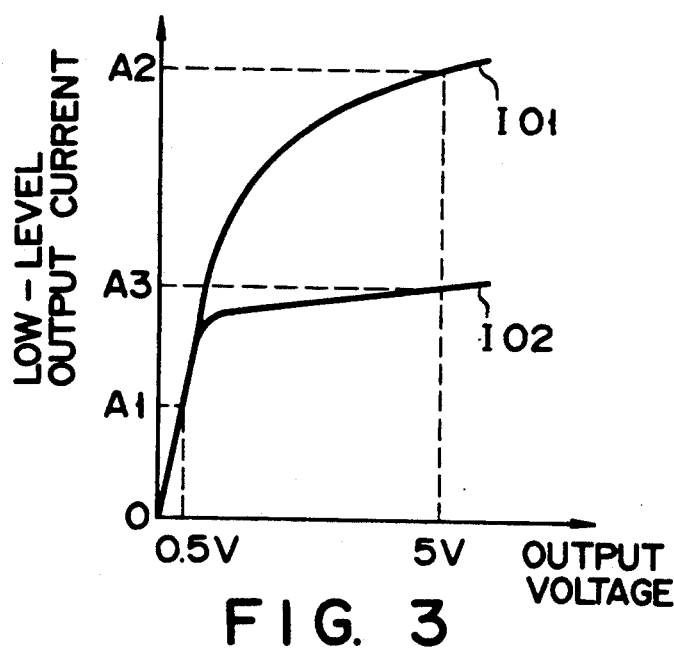
FIG. 3 is a graph showing a relationship between output voltages and output currents in the circuits in FIGS. 1 and 2.

Reference symbol I02 in FIG. 3 indicates an output current wherein the npn transistor Q12 is set in an ON state.

In this case, when an output voltage Vout is low, as is indicated by reference symbol A1 in FIG. 3, as in the circuit shown in FIG. 1, a current having a value corresponding to the specification of the circuit is supplied to the npn transistor Q12.

When the output voltage Vout is high, since a current supplied to the base of the transistor Q12 is increased, the voltage drop across the resistor R12 is increased, and a voltage applied to the p-channel MOS transistor M11 is decreased. Therefore, a current flowing through the p-channel MOS transistor M11 is decreased, and the base current of the npn transistor Q12 is limited. As is indicated by reference symbol A3 in FIG. 3, the output current is limited to about 200 to 300 mA.

According to the above embodiment, the transistor Q12 in the output section is driven through the resistor R12 and the MOS transistor M11 having drivability lower than that of a bipolar transistor. When the output voltage of the transistor Q12 is low, a desired current value can be obtained. When the output voltage is high, the output current can be reduced compared with a conventional one. Therefore, a variation in power source voltage can be suppressed, and erroneous operations of other circuits can be prevented.

Since the number of bipolar transistors can be reduced compared with a conventional circuit, a pattern area can be decreased.

Note that the present invention is not limited to this embodiment, and various modifications can be made without departing from the spirit and scope of the invention.

INDUSTRIAL APPLICABILITY

As described above, according to the present invention, when an output voltage is low, a desired current value can be assured. When the output voltage is high, supply of a large current can be prevented. Therefore, a variation in power source voltage is suppressed, and an influence on other circuits can be controlled. The output circuit can be probably utilized as an output circuit of an integrated circuit.

We claim:

1. An output circuit comprising:
   first and second bipolar transistors which have output terminals connected to each other and which are alternatively turned on and off in response to an input signal;
   a MOS transistor having a gate and a current path, the input signal being supplied to the gate and a first end of the current path being connected to a power source;
   a resistor, a first end of which is connected to a second end of the current path of said MOS transistor; and
   a diode having a current path connected at a first end to a second end of the resister and at a second end to a base of the second bipolar transistor.

2. An output circuit according to claim 1, further comprising first and second inverters to which the input signal is supplied, an output terminal of the first inverter being connected to a base of the first bipolar transistor and an output terminal of the second inverter being connected to the gate of the MOS transistor.

3. An output circuit according to claim 1, wherein the first and second bipolar transistors are of the same conductivity type.

4. An output circuit comprising:
   first and second bipolar transistors which have output terminals connected to each other and which are alternately turned on and off in response to an input signal;
   a first current supply circuit for generating a first signal in response to the input signal and for supplying the generated signal to a base of the first bipolar transistor;
   a second current supply circuit for generating a second signal in response to the input signal;
   a MOS transistor having a gate and a current path, the gate being connected to an output terminal of the second current supply circuit and one end of the current path being connected to a power source;
   a resistor, a first end of which is connected to a second end of the current path of said MOS transistor; and
   a diode having a current path connected at a first end to a second end of the resister and at a second end to a base of the second bipolar transistor.

5. An output terminal according to claim 4, wherein said first current supply circuit comprises first and second inverters for sequentially inverting the input signal.

6. An output circuit according to claim 4, wherein said second current supply circuit includes an inverter for inverting the input signal.

7. An output circuit according to claim 6, wherein the first and second bipolar transistors are of the same conductivity type.

8. In output circuit comprising:
   a first inverter for inverting an input signal;
   a second inverter for inverting an output signal from said first inverter;
   a first bipolar transistor having a current path connected between a first power source and an output terminal and having a base for receiving an output signal from said second inverter;
   a third inverter for inverting an output signal from said first inverter;
   p- and n-channel MOS transistors each having a gate for receiving an output signal from said third inverter;

a resistor connected between drains of said p-channel and n-channel MOS transistors; and a second bipolar transistor having a base connected between said resistor and said n-channel MOS transistor and a current path connected between said output terminal and a second power source.

9. An output circuit according to claim 8, characterized in that said first, second, and third inverters each comprises a MOS transistor.

* * * * *

UNITED STATES PATENT AND TRADEMARK OFFICE
CERTIFICATE OF CORRECTION

PATENT NO. : 5,198,704
DATED : March 30, 1993
INVENTOR(S) : Yoshinori Nitta et al.

It is certified that error appears in the above-indentified patent and that said Letters Patent is hereby corrected as shown below:

Claim 1, column 4, line 14, change "resister" to --resistor--.

Claim 3, column 4, line 45, change "resister" to --resistor--.

Claim 8, column 4, line 56, change "In" to --An--.

Signed and Sealed this

Twelfth Day of April, 1994

Attest:

BRUCE LEHMAN

Attesting Officer

Commissioner of Patents and Trademarks